United States Patent
Ahmad et al.

(10) Patent No.: US 7,621,190 B2
(45) Date of Patent: Nov. 24, 2009

(54) METHOD AND APPARATUS FOR STRAIN MONITORING OF PRINTED CIRCUIT BOARD ASSEMBLIES

(75) Inventors: Mudasir Ahmad, Santa Clara, CA (US); Sue Teng, Belmont, CA (US)

(73) Assignee: Cisco Technology, Inc., San Jose, CA (US)

( * ) Notice: Subject to any disclaimer, the term of this patent is extended or adjusted under 35 U.S.C. 154(b) by 276 days.

(21) Appl. No.: 11/358,271

(22) Filed: Feb. 21, 2006

(65) Prior Publication Data

US 2007/0205791 A1   Sep. 6, 2007

(51) Int. Cl.
    *G01L 1/22*   (2006.01)
(52) U.S. Cl. .................................. 73/862.474
(58) Field of Classification Search ............ 73/769, 73/774, 775, 778, 788, 862.474
    See application file for complete search history.

(56) References Cited

U.S. PATENT DOCUMENTS

| | | | | |
|---|---|---|---|---|
| 3,626,256 A | * | 12/1971 | Brown | 257/417 |
| 4,104,605 A | * | 8/1978 | Boudreaux et al. | 338/2 |
| 4,179,940 A | * | 12/1979 | Oertle et al. | 73/808 |
| 4,875,533 A | * | 10/1989 | Mihara et al. | 177/144 |
| 4,939,496 A | * | 7/1990 | Destannes | 338/2 |
| 5,154,247 A | * | 10/1992 | Nishimura et al. | 177/211 |
| 5,306,873 A | * | 4/1994 | Suzuki et al. | 174/250 |
| 5,508,676 A | * | 4/1996 | Grange et al. | 338/2 |
| 5,526,208 A | * | 6/1996 | Hatch et al. | 360/294.1 |
| 5,539,674 A | * | 7/1996 | Barbier et al. | 702/138 |
| 5,675,089 A | * | 10/1997 | Hawkins | 73/801 |
| 5,969,260 A | | 10/1999 | Belk et al. | |
| 6,201,220 B1 | * | 3/2001 | Leturia Mendieta | 219/461.1 |
| 6,451,187 B1 | * | 9/2002 | Suzuki et al. | 204/426 |
| 6,504,114 B1 | * | 1/2003 | Lockery et al. | 177/229 |
| 6,647,797 B2 | * | 11/2003 | Miodushevsky | 73/774 |
| 6,948,377 B2 | | 9/2005 | Wingett et al. | |
| 7,036,387 B2 | | 5/2006 | Ong et al. | |
| 7,094,061 B1 | * | 8/2006 | Kieffer et al. | 439/65 |
| 7,096,748 B2 | | 8/2006 | Kutlu | |
| 7,104,138 B2 | * | 9/2006 | Otobe et al. | 73/766 |
| 2007/0151358 A1 | * | 7/2007 | Chien et al. | 73/790 |

* cited by examiner

*Primary Examiner*—Lisa M Caputo
*Assistant Examiner*—Freddie Kirkland, III
(74) *Attorney, Agent, or Firm*—BainwoodHuang

(57) ABSTRACT

A technique of monitoring strain on a printed circuit board assembly involves the use of a strain detector mounted on a printed circuit board. The strain detector is formed of a non-ductile material. The strain detector has a narrowed portion forming a weak link that has a characteristic of breaking when a critical strain limit is exceeded. The method of monitoring can include visual or electrical inspection. The electrical inspection can include having a strain monitoring device. The strain monitoring device has a timer connected to at least one strain detector and a memory for storing results connected to the timer. The capacitance of at least one of the strain detectors is sampled and any change in capacitance is recorded to the memory. In one embodiment, a time stamp occurs in the memory based on when an electrical property changes across at least one of the strain detectors.

16 Claims, 9 Drawing Sheets

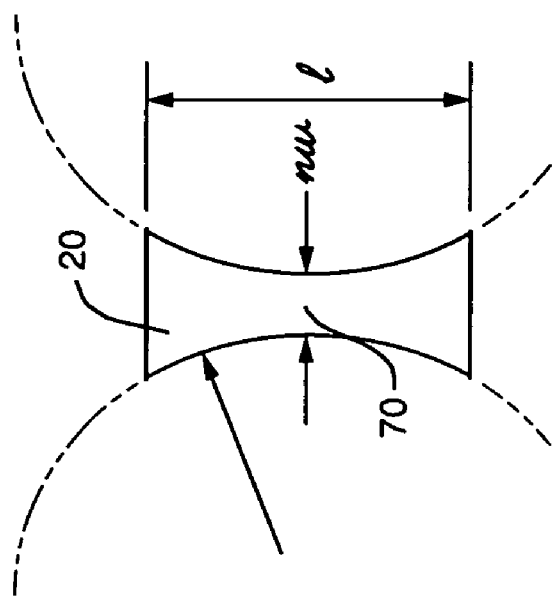
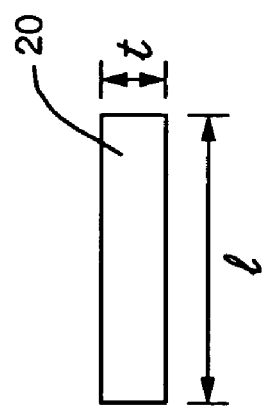
FIG. 3C
FIG. 3B
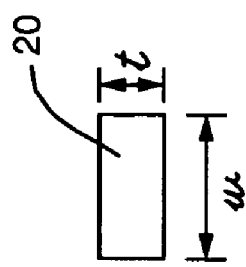
FIG. 3A

METHOD AND APPARATUS FOR STRAIN MONITORING OF PRINTED CIRCUIT BOARD ASSEMBLIES

BACKGROUND

Printed circuit board assemblies (PCBAs) are used in numerous equipment including computers, telephones, major appliances, vehicles such as automobiles, trains, and planes, and toys, etc. The printed circuit boards (PCBs) are getting more crowded with items such as integrated circuits, resistors, heat sinks, and other components.

A series of processes is required to create the printed circuit board and add the components to the printed circuit board to create the completed printed circuit board assembly. Unfortunately the printed circuit board assembly manufacturing process does not result in each of the printed circuit board assemblies working perfectly. The components and the printed circuit board, while not expensive individually, together produce an expensive item. In addition, there is a time and cost factor in determining which printed circuit board assembly (PCBA) works properly and which PCBA does not work properly. In some situations, the cost and time involved in detecting non-functioning PCBAs is not acceptable, therefore requiring that the through-put of quality PCBAs be nearly 100%.

One type of failure in the printed circuit board assembly is strain-induced failure. Strain-induced failures can be created by various factors. These strain-induced failures include cracked BGA (ball grid array) solder joints, intermittent opens of conductive traces and joints, cracked printed circuit boards (PCB), and cracked capacitors. One method of determining what caused the strain is to affix strain gages to the printed circuit board. The strain gage has a series of wires connected to the strain gage on the circuit board which extend to instrumentation that monitors the strain on the printed circuit board.

SUMMARY

Unfortunately, there are deficiencies to the above-described method of using strain gages to determine what caused the strain-induced failure. These deficiencies include the expense of mounting the strain gages on the printed circuit board, the time and other delays and cost resulting from having wires extending from the strain gage interfering with the assembly process. Furthermore there is a coordination requirement between the testing of and/or monitoring of the strain gage during the assembly and the actual assembly of the printed circuit board assembly. Furthermore the printed circuit board assemblies (PCBA) cannot be used for commercial products for numerous reasons including the strain gage and associated wires' appearance and interference with the customer's final use. Therefore, the costs of the PCBA and the strain gage have to be factored into how many PCBAs are to be monitored in that both the PCBA and strain gage are sacrificed.

In contrast to the above-described conventional monitoring methods for detecting strain, improved techniques are directed to monitoring a strain by a strain detector formed of a non-ductile material. Failure can be determined visually or electrically and the proposed method does not require expensive strain gages or limit sampling to merely a sample of the printed circuit board assemblies manufactured.

One embodiment is a printed circuit board assembly having a circuit board substrate. The board substrate has a plurality of mounting points for receiving electrical components and a plurality of electrically conductive pathway traces on the board substrate between mounting points. At least one strain detector is mounted on the flat board. The strain detector is formed of a non-ductile material. The strain detector has a narrowed portion forming a weak link that has a characteristic of breaking when a critical strain limit is exceeded.

In one embodiment the strain detector has a dog-bone shape. In another embodiment, the strain detector has a rectangular shape with an opening to define at least one narrow portion.

In an embodiment, a monitoring system is carried by the printed circuit board. The monitor system has a timer and a memory for recording the change in electrical capacitance of at least one strain detector. In one embodiment, one of the electrical components on the printed circuit board is an integrated circuit. At least two strain detectors are located on the printed circuit board. Each strain detector is located in proximity to a corner of the integrated circuit. The strain detector extends along a longitudinal axis that bisects adjacent corners of the integrated circuit.

A method of monitoring a printed circuit board assembly for strain related failure is to observe the strain detector to determine if the printed circuit board assembly has a strain related failure. One method is to visually observe the strain detector by methods such as surface dye penetrant or ultrasound. Another method is to observe electrically by testing the capacitance of the strain detector and determining if it has changed.

One method of monitoring a printed circuit board assembly for strain related failure is to have a strain monitoring device having a timer connected to at least one strain detector and a memory for storing results connected to the timer. The capacitance of at least one of the strain detectors is sampled and any change in capacitance is recorded to the memory. In one embodiment, a time stamp occurs in the memory based on when the capacitance across at least one of the strain detectors changes. In one embodiment, the strain detectors are wired together in parallel.

The proposed method can be done with every PCBA, in contrast to the strain gage method where the strain gage cannot be placed on every functional production PCBA: the PCBA with the strain gage cannot generally be used as a finished product for the customer as indicated above. The prior method only allows sampling to determine the strain introduced in the process. In the current method individual assemblies can be monitored in situ which was not possible in the strain gage method.

BRIEF DESCRIPTION OF THE DRAWINGS

The foregoing and other objects, features, and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

FIG. 3A is a side view of a strain detector;

FIG. 3B is a second side view of a strain detector;

FIG. 3C is a top view of a strain detector;

DETAILED DESCRIPTION

An improved method of testing/monitoring a printed circuit board assembly (PCBA) for strain-induced failures utilizing at least one strain detector mounted on the printed circuit board where the strain detector is formed of a non-ductile material. The strain detector has a narrowed portion to define a weakest link for failure at a pre-defined strain range. The failure of the strain detector and the reaching of a strain in the critical strain range can be determined visually or electrically. Accordingly, the conventional approach of using a strain gage with its associated cost and limited to only a sampling of the PCBAs is unnecessary.

Figure 1:
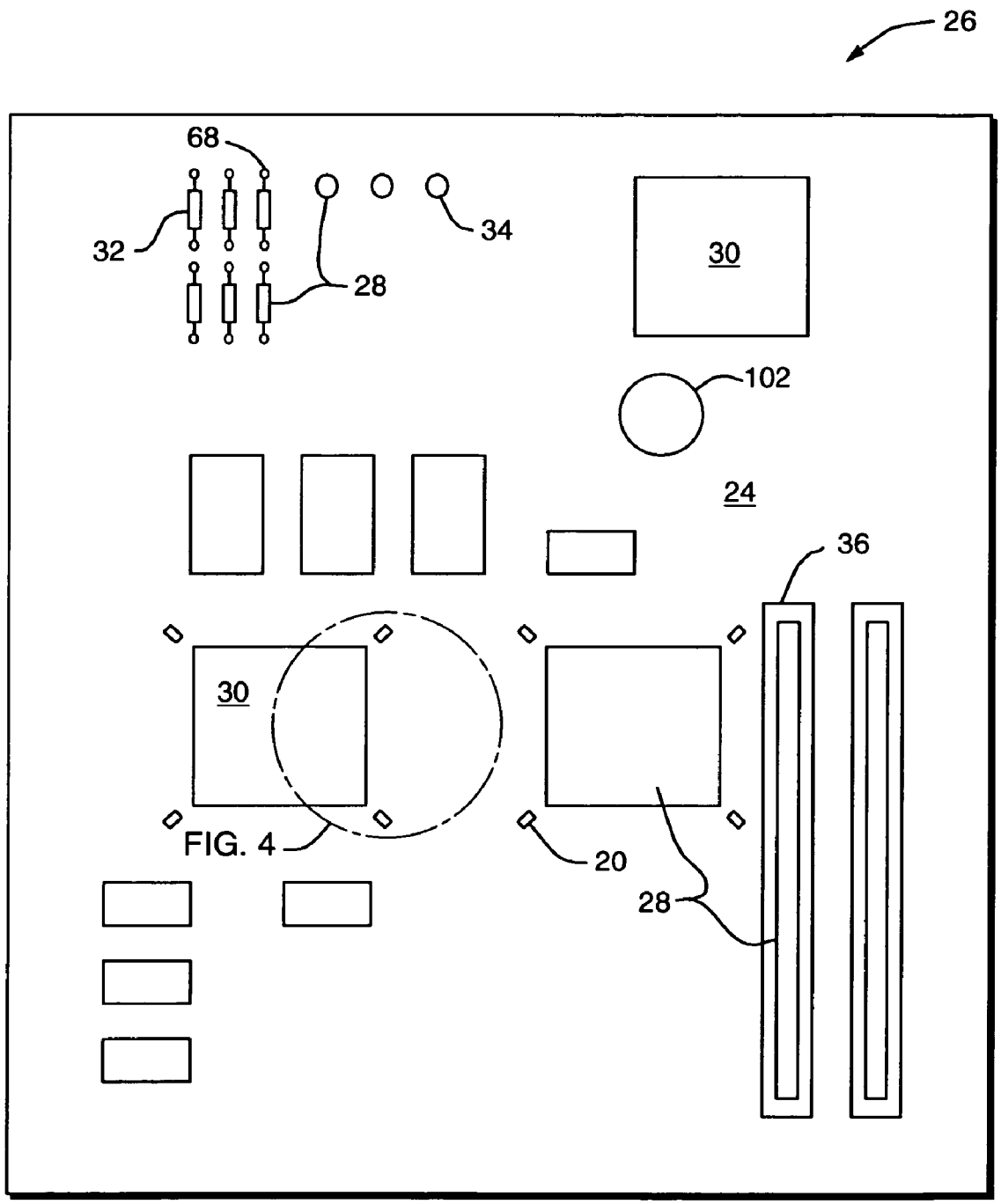
FIG. 1 is an example of a top view of a printed circuit board assembly.

When referring to the drawing in the description which follows, like numerals indicate like elements. FIG. 1 shows a strain detector 20 located on a printed circuit board (PCB) 24 of a printed circuit board assembly (PCBA) 26.

Figure 4:
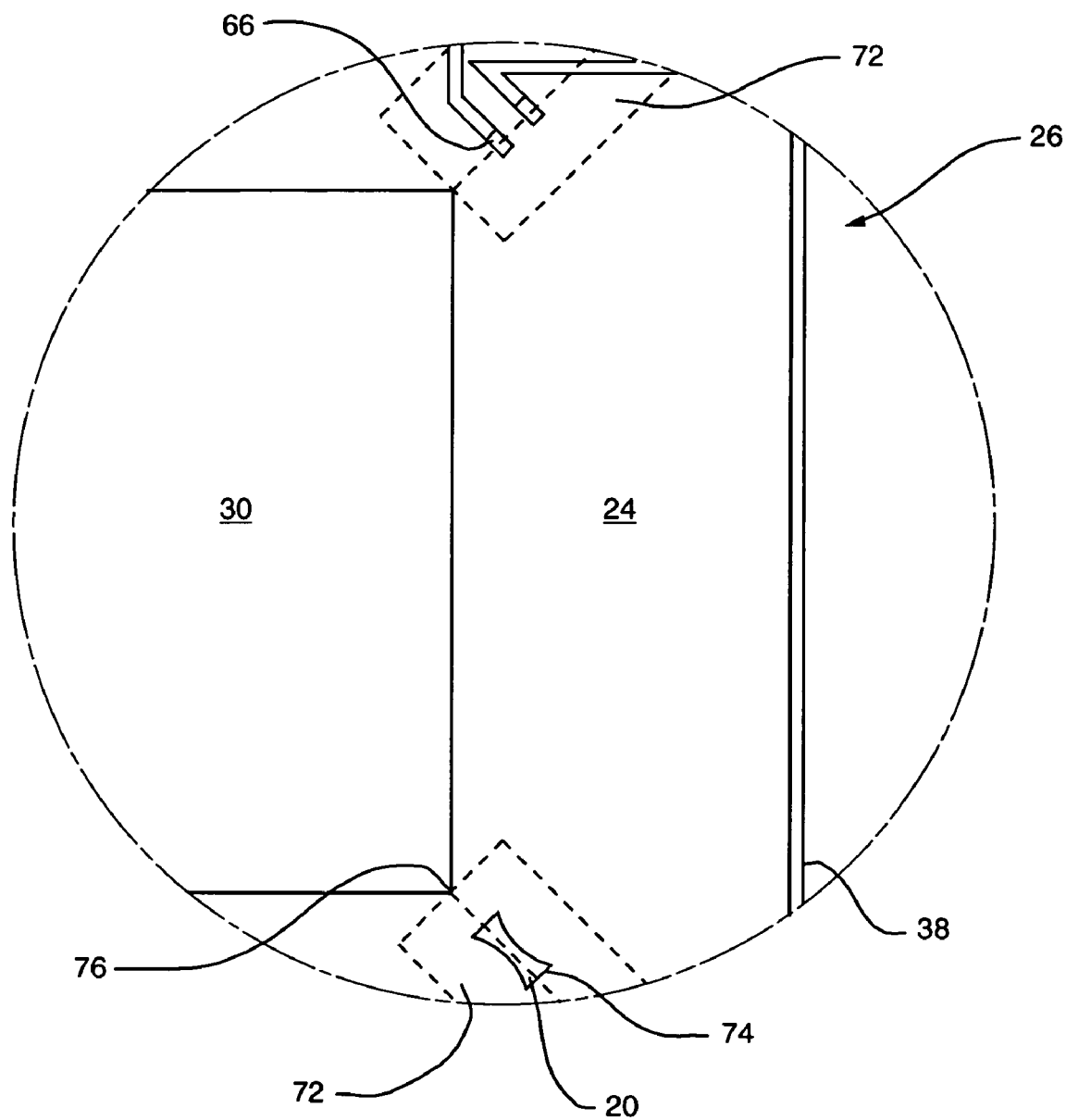
FIG. 4 is an enlarged view of a printed circuit board taken along the line 4 of FIG. 1-1.

Referring to FIG. 1, the printed circuit board assembly (PCBA) 26 is shown. The PCBA 26 has a series of components 28 such as chips or integrated circuits 30, resistors 32, capacitors 34, and card slots 36 located on the printed circuit board (PCB) 24. These components 28 are connected by a series of traces 38, as seen in FIG. 4, formed of conductive material. The conductive traces 38 can be located on either side of the PCB 24 or in an interposed conductive layer of the PCB 24.

Figure 2:
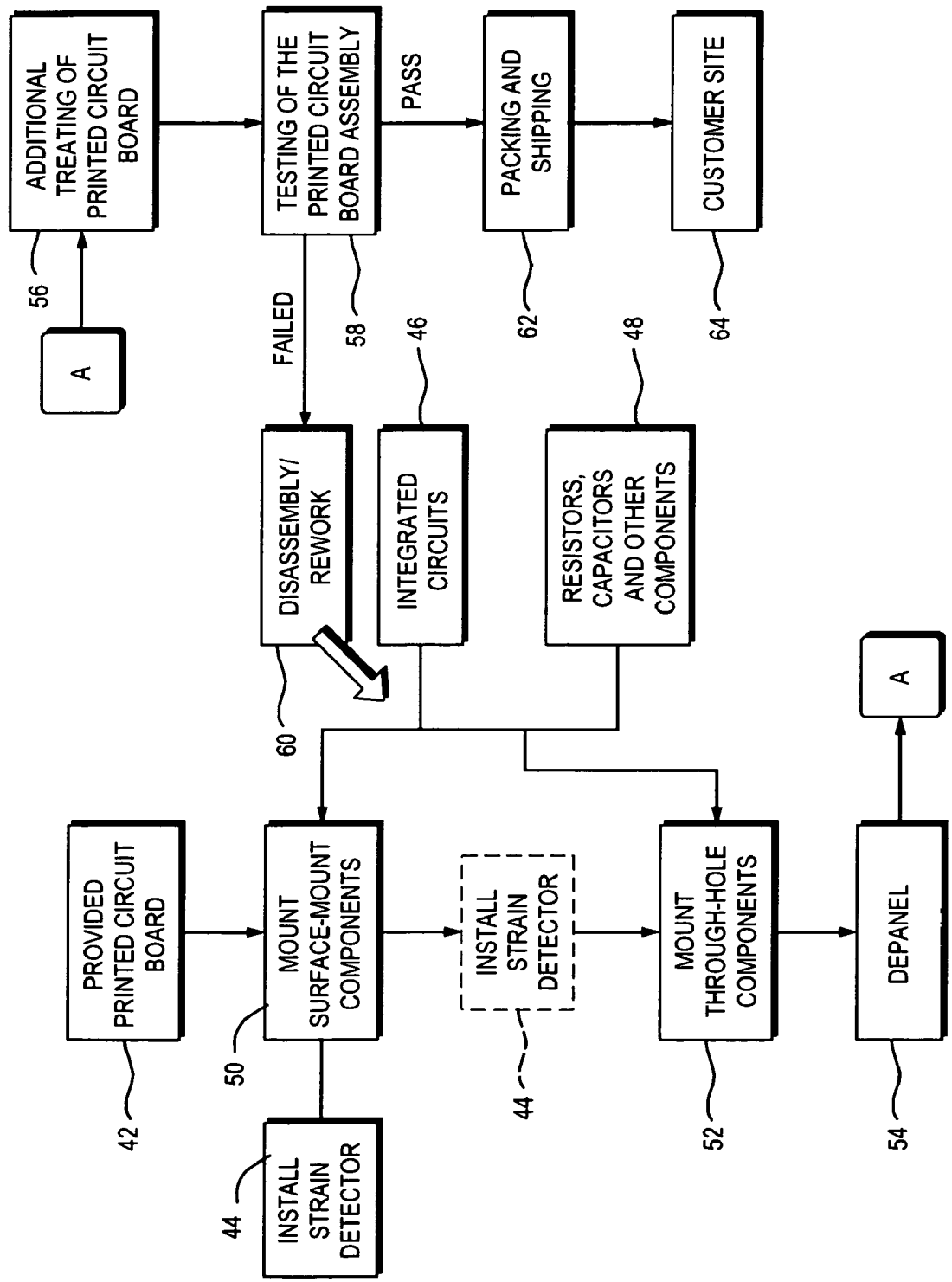
FIG. 2 is a flow chart of the process of the assembly and handling of the printed circuit board assembly.

FIG. 2 shows a flow chart of the process of manufacturing the printed circuit board assembly (PCBA) 26 through the delivery of the PCBA 26 to the customer site. Block 42 represents providing the printed circuit board (PCB) 24. There are numerous steps in creating a PCB 24 in order to get the conductive traces 38 located in the proper position. In addition, the PCB 24 has a plurality of pads 66 and may have holes 68, as seen in FIG. 4 and FIG. 1 respectively, for receiving components 28. As part of preparing the PCB 24, holes may be drilled through the PCB which generally has two or more layers of copper clad with an interposed insulation substrate(s). An image of the circuit is placed on the PCB 24, including the image of the conductive traces. After a series of steps including adding and removing material, adding additional coating, masking or coatings and machining as required, the PCB 24 is inspected prior to the next step. This next step can be shipping the PCB 24 to a customer for assembly of the PCBA 26 on the PCB 24.

In designing the layout of the printed circuit board 24, the designer needs to determine the location for each component 28 and conductive trace 38. The designer needs to consider several factors in the layout of the components 28 on the PCB 24 to create the printed circuit board assembly (PCBA) 26. One objective is typically to minimize the size of the PCB 24 required and minimize the length of each conductive trace 38 for cost considerations and timing within the circuit considerations. In addition, the designer needs to be cognitive of the assembly process and what strains may occur during processing. The strain detectors 20 as described are minimal in size and the designer can determine locations to place the strain detectors 20 on the PCB 24 to allow for the monitoring of strain. However, as described below in more detail, the strain detectors 20 may be able to be installed on the PCB 24 in which it was not contemplated to do so previously.

With the printed circuit board (PCB) 24 completed, the components 28, which have been produced separately, are ready to be mounted to the PCB 24. One such component 28 is the strain detector 20. Still referring to FIG. 2, block 44 represents mounting at least one strain detector 20 to the PCB 24. While the strain detector 20 can be mounted to the PCB 24 anywhere along the process, FIG. 2 illustrates the mounting of the strain detector 20, block 44, concurrently with mounting the surface mount components in block 50. The earlier the strain detector 20 is mounted in the process allows the strain detector 20 to monitor the strain for a longer part of the process.

The strain detector 20 is planar and has a uniform thickness as seen in FIGS. 3A and 3B. Referring to FIG. 3C, a top view of the strain detector 20 is shown. The strain detector 20 has a narrowed portion 70, or necked down region. The narrowed portion 70 produces a stress concentration at the location. The strain detector 20 is made of a non-ductile material that has a characteristic of breaking when a critical strain range is exceeded. One of the criteria for selecting the strain detector 20 material is that the material has little or no plastic deformation.

The narrowed portion 70 of the strain detector is the weakest link of the material, the point at which the strain detector will crack if the strain applied exceeds a pre-defined limit.

In contrast to the strain gage, the strain detector 20 is not monitoring the actual strain to give an output. Rather the strain detector 20 determines if the strain on the PCB 24 has exceeded a certain threshold.

In an embodiment, the strain detector 20 is made of alumina, aluminum oxide, of over 99 percent purity and cure cold fired. One alternative material for the strain detector 20 is Zirconia, $ZrO_2$.

Still referring to FIGS. 3A-3C in an embodiment, the strain detector 20 has a uniform thickness t of 1 mm, a length l of 5 mm, a width w of 2.5 mm, and a narrowed portion 70 wherein the minimum width is the narrowed down width nw of 1.0 mm. If the strain detector is made of alumina as described above, the strain detector 20 has a critical strain range of between 500-2000 $\mu\epsilon$ (micro strain).

It is recognized that the dimensions of the strain detector 20 can be designed such that the strain detector 20 breaks at any pre-defined strain range. The strain detector 20 is designed to have the strain detector 20 crack at a pre-defined strain range. This is in contrast to a strict strain value. One skilled in the art can design the strain detector 20 based on the desired strain range.

Each strain detector 20 is glued onto the printed circuit board (PCB) 24 in the pre-defined areas 72 on a pair of pads 66 on the PCB 24 as seen in FIG. 4 by mechanical or automated equipment. The glue can be dispensed via syringe manually or by automated equipment. The strain detector 20 is held in place for a period of time to allow for the glue, the adhesive, to be polymerized.

The strain detector 20 should be installed at a critical high-strain location on the printed circuit board (PCB) 24 of the printed circuit board assembly (PCBA) 26. The critical high-strain locations can be determined by finite element modeling that simulates typical bending tests, such as three point bending testing. The location on the PCB 24 shown where the strain may be critical is suspected to be in proximity to two of the integrated circuits 30 in this illustrated example shown in FIG. 1.

The installation of the strain detector 20 early in the manufacturing process, as explained above, allows for the monitoring of strains induced during the entire assembly of the printed circuit board assembly (PCBA) 26, shipping, and the customer installation and use.

Block 46 represents the integrated circuits 30 that were manufactured for assembly of the printed circuit board assembly (PCBA) 26. Block 48 represents other components 28 such as resistors 32 and capacitors 34. The PCBA 26 can have the components 28 mounted in various ways to the printed circuit board (PCB) 24.

Block 50 represents one method of mounting, that of surface-mounting of components 28. The printed circuit board (PCB) 24 is treated with a solder paste, which can be done with a printing method. The components 28 such as integrated circuits 30 are positioned on the PCB 24. The PCB 24 with the components 28 are sent through a reflow oven. The process would be repeated for a two-sided PCB 24. Block 44 represents mounting the strain detectors 20 on the printed circuit board 24 concurrently.

The block 44 in hidden line shows an alternative where the strain detectors 20 are mounted after the surface-mounting components and prior to the mounting of the through-hole components 28 represented by block 52. It is recognized that the mounting of the strain detector 20 can be incorporated into other portions of the process such as part of block 52 or prior to block 50.

Block 52 represents another method of mounting, that of mounting through-hole components 28 and connectors. After the leads of the components 28 and the connectors are placed through the holes 68 in the PCB 24, the leads are soldered to the associated pads 66 on the PCB 24 with one of various selected methods such as wave soldering.

Still referring to FIG. 2, a plurality of PCBAs 26 could have been manufactured together; the PCBs 24 need to be broken into the separate PCBAs. This step could have occurred early in the assembly of the PCBA 26. Block 54 represents the depaneling or breaking the PCBs 24 apart. Block 56 in FIG. 2 represents additional treating of the PCBA 26, which can include applying coating, potting, or assembly.

The PCBA 26 is then typically subjected to in-circuit testing (ICT) to test the integrated circuits 30 and other components 28. Block 58 in FIG. 2 represents this testing. Other testing can include inspection of components and joints by methods such as visual inspection and x-ray inspection. In addition, there can be other testing including environmental testing. During the testing, if it is determined that there is a problem with the PCBA 26, the PCBA 26 can be disassembled and reworked as represented by block 60. The rework can go back to block 50 if necessary.

After the ICT, the PCBA 26 is packaged and shipped, as represented by block 62, to the customer site, as represented by block 64. During the entire process from block 42 through block 64, an event can cause excessive strain. Excessive strain could be caused anywhere in the assembly process such as handling, heat-sink attachment, final assembly, in-circuit testing (ICT), disassembly, rework, shipping, or even at the customer site.

Referring to FIG. 4, an enlarged view of a portion of the PCBA 26 is shown. A portion of one of the integrated circuits 30 is shown. In the embodiment shown, the integrated circuit 30 has ball grid array (BGA) connector that is surface mounted. A strain detector 20 is shown. The strain detector 20 extends along a longitudinal axis that bisects with the corner of the integrated circuit 30. A pair of pads 66 are shown in proximity to another corner of the integrated circuit 30. A conductive trace 38 is also shown.

Figure 5:
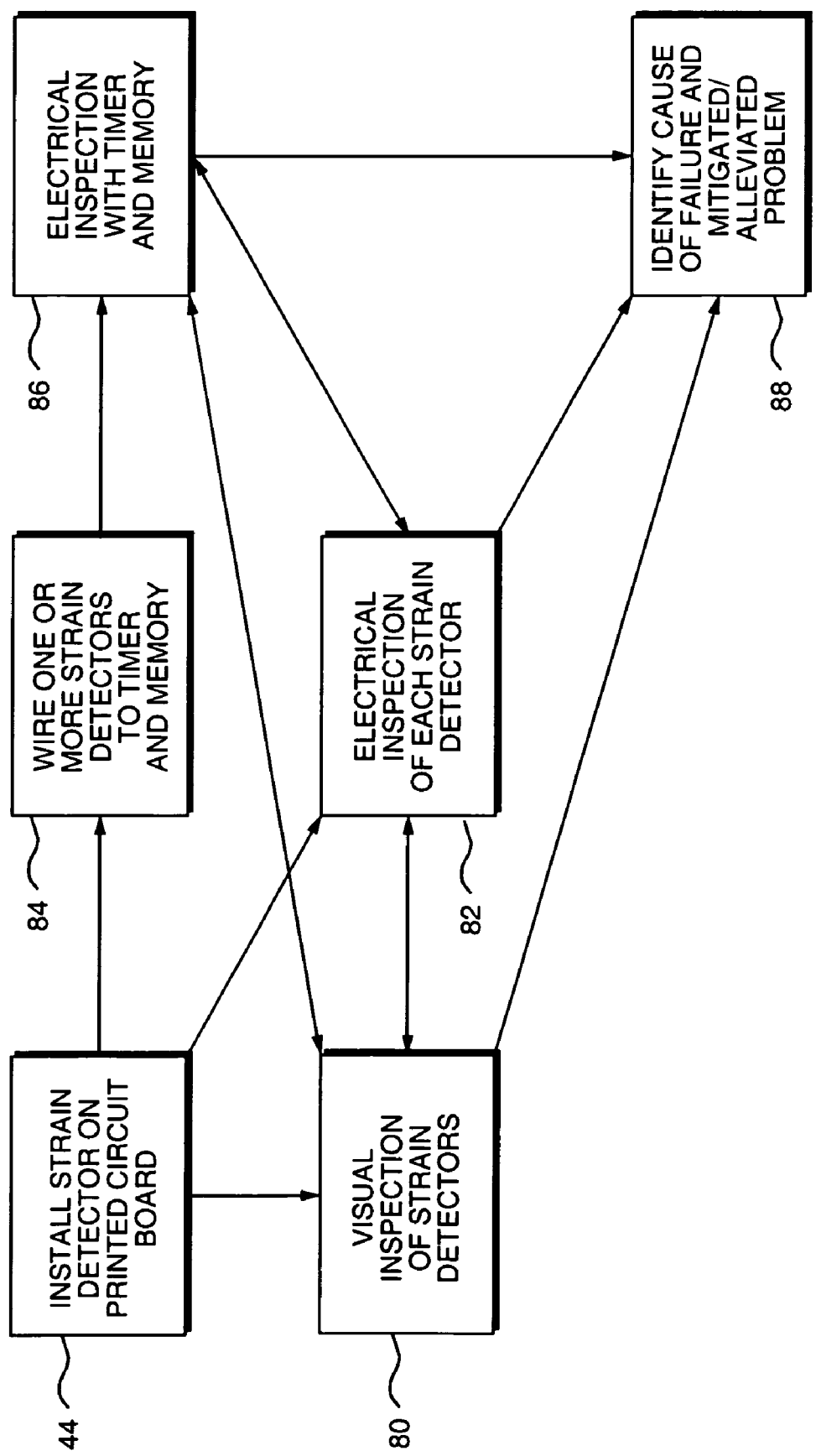
FIG. 5 is a flow chart of strain detection.
Figure 6:
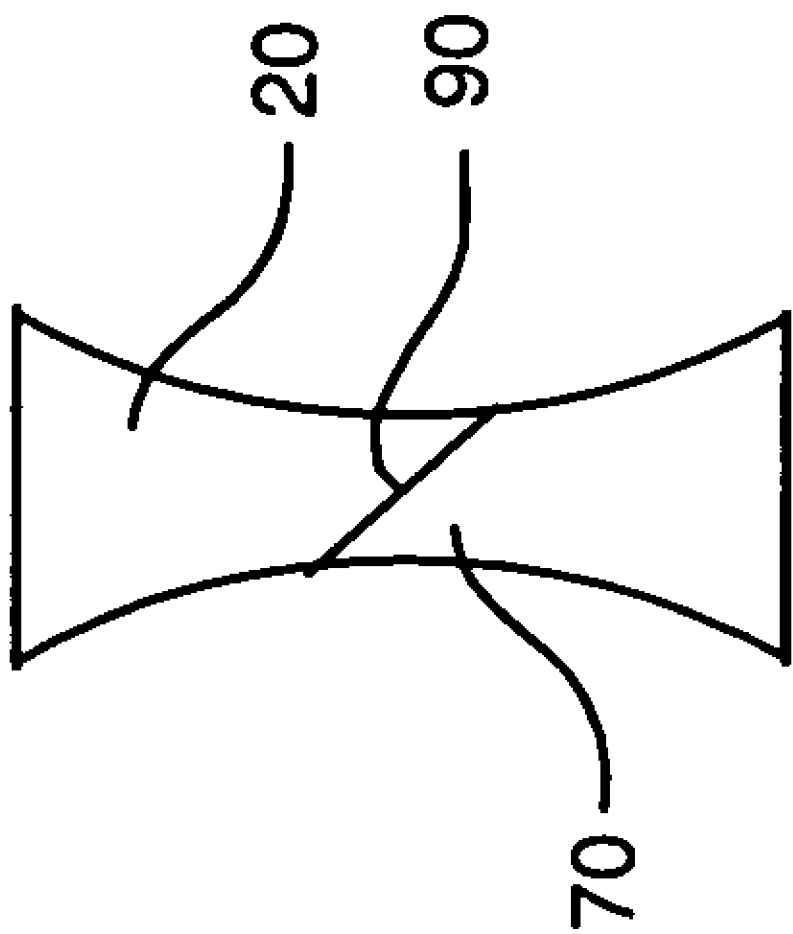
FIG. 6 is a top view of a strain detector with a visual crack.

Referring to FIG. 5, in contrast to the conventional strain gage, the strain detector 20 can be used in multiple ways to determine if excess strain has occurred anywhere in the assembly process. Block 44 represents installing the strain detector 20 on the printed circuit board 24 as described above. One method of determining excess strain/strain failure is to visually look at the strain detector 20 as represented by block 80 of FIG. 5. FIG. 6 shows a representation of the strain detector 20 with a crack 90 that occurs. The visual detection can occur by several methods including using surface dye penetrant or simple shading/coloring the top surface with a graphite pencil. In additional other non-invasive crack detection techniques such as ultrasound can be used.

Another method of detecting if excess stain has occurred is to use electrical detection as represented by block 82 in FIG. 5. At least one electrical property of the strain detector 20 will change if there are any cracks, such as the crack 90, in the strain detector 20. For example, the capacitance or resistance properties of the strain detector 20 will change if the strain detector 20 forms a crack because of excess strain. In the embodiment using the alumina, alumina is an excellent dielectric material. In this method, the testing to determine if strain induced failure has occurred is done after the crack 90 has occurred in the strain detector 20.

Figure 7:
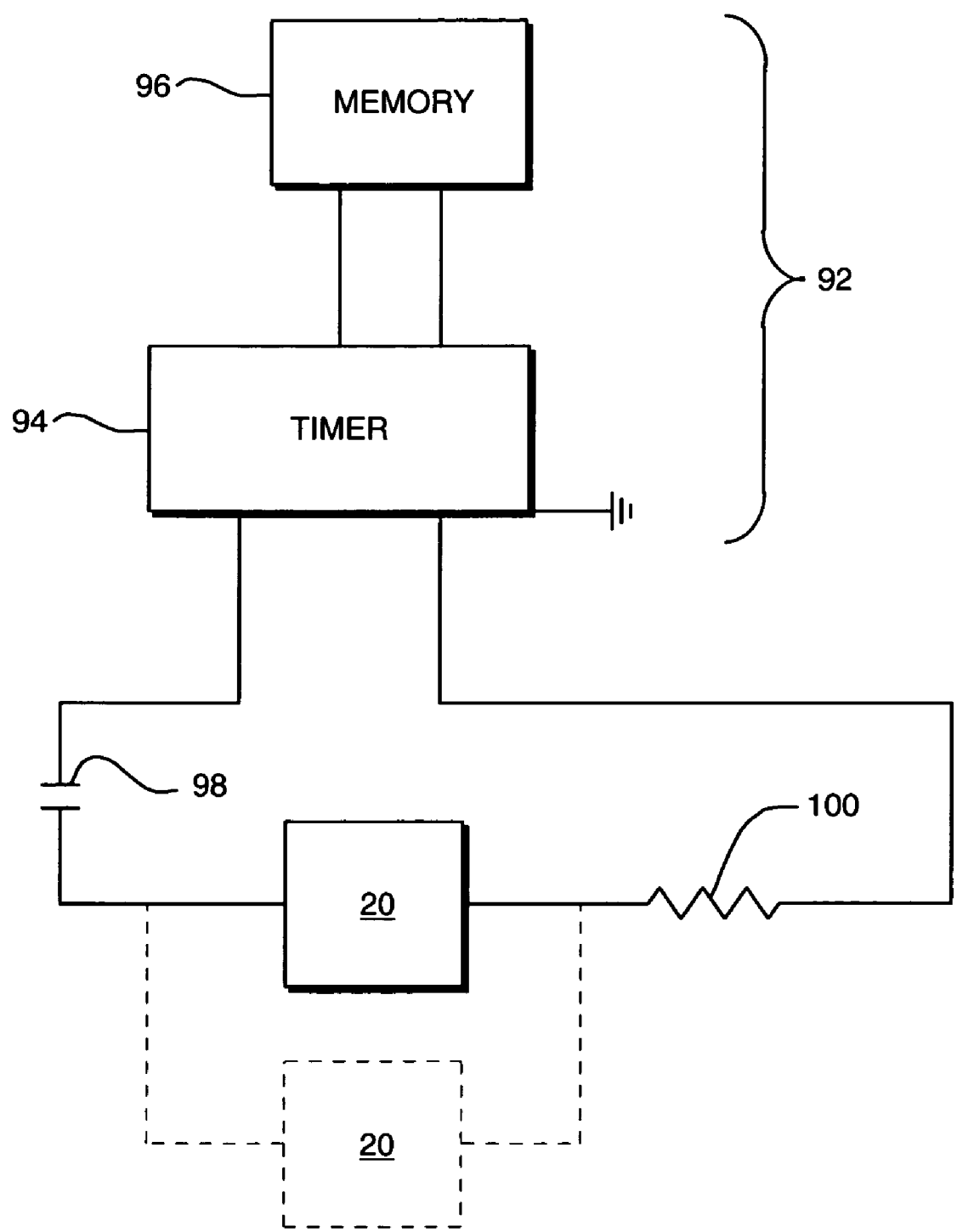
FIG. 7 is a schematic view of an electrical detection device.

A third method of detecting excess strain is to connect one or more of the strain detectors 20 in parallel to a real-time strain monitoring device 92 having a timer 94 and a memory chip 96 as seen in FIG. 7 and represented by block 84 in FIG. 5. FIG. 7 is a schematic of the circuit of the real-time strain monitoring device 92 showing a strain detector 20 connected to the timer 94 and the memory chip 96. The real-time strain monitoring device 92 has a capacitor 98 and a resistor 100 in series with the strain detector 20. The components of the real-time strain monitoring device 92 are part of the components 28 installed as part of the steps represented by blocks 50 and 52 of FIG. 2. This type of monitoring does not work until the components of the real-time strain monitoring device 92 are mounted to the PCB 24 and there is power. In an embodiment, a battery 102, such as shown in FIG. 1, is carried by the PCBA 26 to power the real-time strain monitoring device 92 so that the real-time strain monitoring device 92 can monitor change in capacitance as illustrated by block 86 in FIG. 5.

The baseline capacitance for the real-time strain monitoring device 92 is determined. Any cracks in one or more strain detectors 20 that are connected to the real-time strain monitoring device 92 will cause the capacitance to change. The timer 94 will store the time of capacitance change in the memory 96.

In an embodiment, the timer 94 is a 555 timer circuit and the memory 96 is an electrically erasable programmable memory (E2PROM). The memory 96, the E2PROM will be set to be FIFO (First In First Out) to record a specific length of data, such as 60 minutes of data. The timer 94 will constantly write to the memory 96. If the amount of data exceeds the memory, the earlier data is overwritten. Such operations enable the user to nevertheless determine when the capacitance damage occurs by storing the most current information.

When the capacitance changes over time because of a crack 90 in the strain detector 20 as illustrated in FIG. 6, this information is written to the memory 96. When the capacitance changes, the time is recorded to the memory 96. An algorithm on the circuit causes the timer 94 to stop writing to the memory after the change in capacitance so the time when the capacitance changed occurred is record and not written over.

Two or more of the strain detectors 20 can be connected in parallel to the same real-time strain monitoring device 92 having the timer 94 and the memory chip 96 as illustrated by a second strain detector 20 shown in hidden line in FIG. 7.

There are many uncertainties in the manufacturing process. Because of this, it has been difficult if not impossible to pin-point and eliminate the cause of excessive strain in the prior method. Still referring to FIG. 5, block 88 represents identifying the cause of failure and then mitigating or alleviating the problem. By having the time recorded when the failure occurred, the user is provided with additional information over the prior method and therefore has a greater likelihood of determining what caused the failure. In addition, by having more strain detectors 20 on a PCBA 26 than strain gages because of both cost and size constraints, additional data can be gathered from determining which detectors 20 failed. Likewise, the possibility of having more PCBAs 26 than simply prototypes or samples configured with strain detectors will provide additional information.

It will now be appreciated that the strain detector 20 is configured to identify if there is excessive strain on the PCBA 26. The excessive strain could have been caused anywhere in the assembly process including handing, in-circuit testing (ICT), heat sink attachment, final assembly, disassembly, or rework. In addition the excessive strain could have occurred during shipping or at the customer site.

Figure 8B:
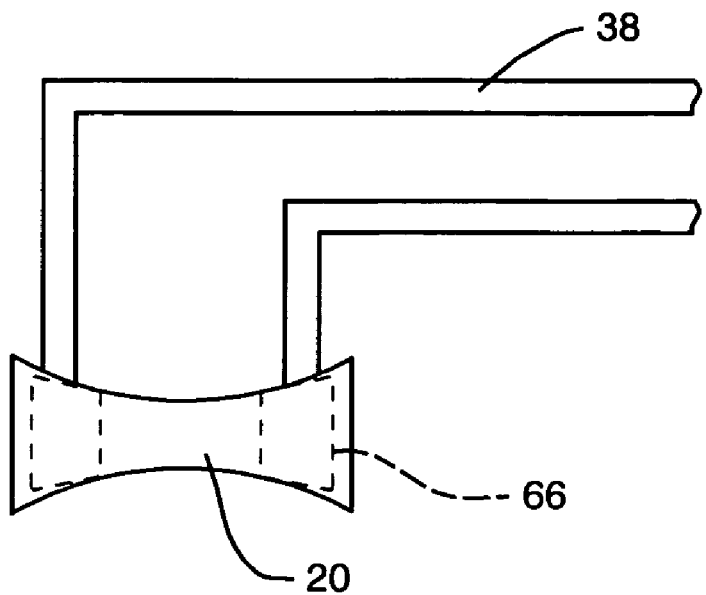
FIG. 8B is a top view of the strain monitor device.
Figure 8A:
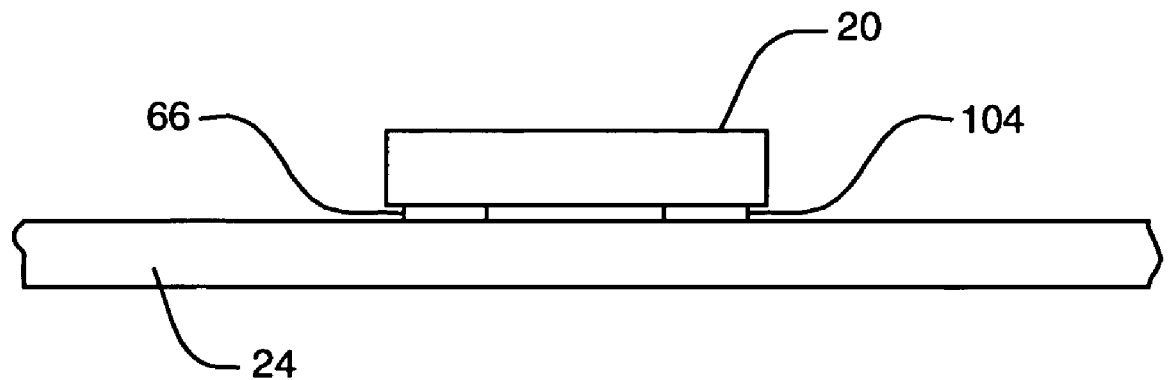
FIG. 8A is a side view of the strain monitor device.

Referring to FIGS. 8A and 8B, the strain detector 20 is glued with an adhesive 104 to pads 66 on the PCB 24. The thickness of the pads 66 is enlarged in FIG. 8A. The pads 66 are shown in hidden line in FIG. 8B. The conductive traces 38 extend from the pads 66 to the real-time strain monitoring device 92.

While FIGS. 8A and 8B show the strain detector 20 glued to the PCB 24, it is recognized that the strain detector 20 can have a solderable back surface. The strain detector can be soldered to the pre-defined pads 66 on the PCB 24. An alternative method is where the strain detector 20 is pre-attached to a kapton tape. The tape can be glued to the pre-defined pads 66 on the PCB 24.

Figure 9A:
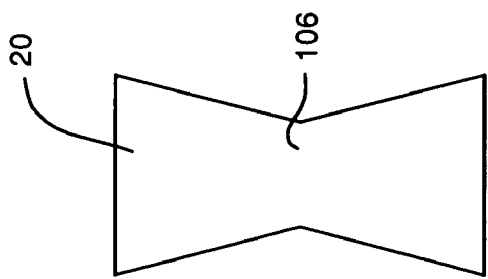
FIGS. 9A-9D show alternative strain monitor devices.
Figure 9B:
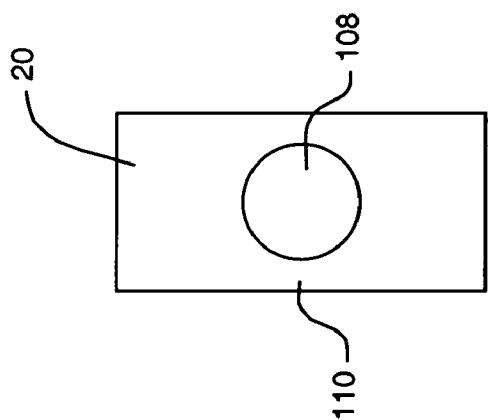
Figure 9C:
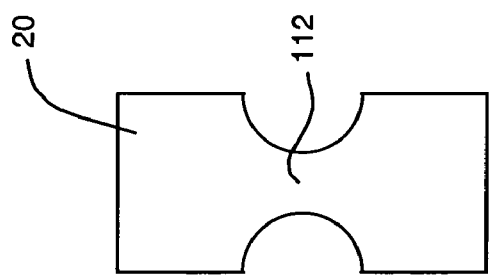
Figure 9D:
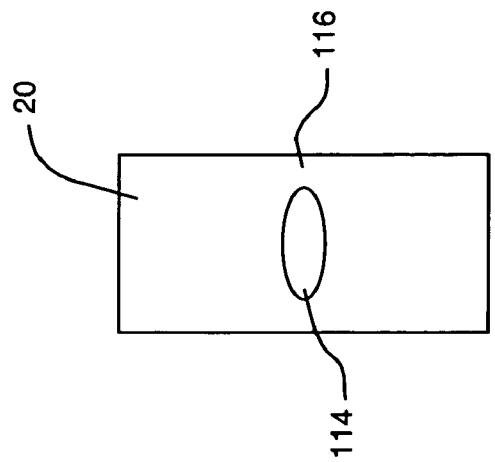

It is recognized that the strain detector can have other configurations than shown in FIGS. 9A-9D. FIG. 9A shows an alternative embodiment of the strain detector 20 which has a narrowed portion 106 created by the sharp intersection of two surfaces in contrast to the more flowing curve of FIG. 3C. FIG. 9B shows an alternative embodiment of the strain detector 20 having a cylindrical hole 108 thereby defining a pair of narrowed portions 110. FIG. 9C has a strain detector 20 wherein the narrowed portion 112 is confined to a smaller portion of the detector 20 than in FIG. 3C. FIG. 9D shows that the opening such as shown in FIG. 9B is not limited to a circular opening or cylindrical opening and the opening 114 can have an oval shape to define a pair of a narrowed portions 116. FIGS. 9A-9D are merely examples of other potential shapes for the strain detector.

In each of the embodiments, there is a narrowed portion to define a weakest link for failure at a pre-defined strain range. The narrowed portion produces a stress concentration at the location. The strain detector 20 is made of a non-ductile material that has a characteristic of breaking when a critical strain range is exceeded.

While this invention has been particularly shown and described with references to preferred embodiments thereof, it will be understood by those skilled in the art that various changes in form and details may be made therein without departing from the spirit and scope of the invention as defined by the appended claims.

For example, the above describes a printed circuit board assembly (PCBA) where the use of the strain detector 20 is contemplated when the printed circuit board is designed. The strain detectors 20 may be able to be installed on the PCB 24 in which it was not contemplated to do so previously. If a high strain region is suspected, the strain detector can either be positioned where a component is not located or on a non-functional prototype the strain detector can be substituted for a resistor or capacitor. While the PCBA will not work in the second case, the strain detector can be used in the identifying of a cause of failure and to mitigate or alleviate the problem, as represented by block 88 in FIG. 5.

What is claimed is:

1. A printed circuit board assembly comprising:
    a circuit board substrate;
    a plurality of mounting points for receiving electrical components carried on the circuit board substrate;
    a plurality of electrically conductive pathways carried on the circuit board substrate between mounting points; and
    at least one strain detector mounted on the circuit board substrate, the strain detector formed of a non-ductile material;
    wherein the strain detector has a portion composed of alumina to provide desired failure of the alumina at an appropriate strain level.

2. A printed circuit board assembly of claim 1, wherein the strain detector has a dog-bone shape defining the narrowed portion.

3. A printed circuit board assembly of claim 1, wherein the strain detector has a rectangular shape with an opening to define at least one narrow portion forming a weak link in the strain detector to allow failure in a pre-defined location at an appropriate strain level.

4. A printed circuit board assembly of claim 1 further comprising:
    a monitor system carried by the board substrate, the monitor system having a timer and a memory for recording the change in electrical capacitance of at least one strain detector.

5. A printed circuit board assembly of claim 4 wherein one of the electrical components is an integrated circuit package having a plurality of corners, and further comprising:
    at least two strain detectors, each strain detector extending along a longitudinal axis, each of the strain detectors located in proximity to a corner of the integrated circuit package, the longitudinal axis of the strain detector bisecting the adjacent corner.

6. A printed circuit board assembly of claim 1:
    wherein the strain detector is made of a single uniform material; and
    wherein the narrowed portion forming the weak link in the detector to allow failure in the pre-defined location is constructed and arranged to produce a stress concentration to allow failure at a pre-defined threshold strain range.

7. A method of testing a printed circuit board assembly for failure comprising the following steps:
    providing a printed circuit board;
    mounting at least one strain detector having a sensing portion formed of a non-ductile material on the printed circuit board;
    monitoring the sensing portion of the strain detector on the printed circuit board to determine if strain related failure has occurred;
    wherein monitoring the sensing portion of the strain detector includes determining if failure has occurred at a pre-defined location on a narrowed portion of the sensing portion of the strain detector that forms a weak link in the detector;
    wherein monitoring includes electrically inspecting the sensing portion to determine if an electrical property of the strain detector has changed mounting at least one integrated circuit package to the printed circuit board, the integrated circuit package having a plurality of corners;

wherein the step of mounting at least one strain detector comprises mounting at least three strain detectors, each of the strain detectors located in proximity to a corner of the integrated circuit package, the longitudinal axis of the strain detector bisecting the adjacent corner; and wherein the step of observation is done by electronic method comprising the step of providing a strain monitoring device having a timer connected to at least one strain detector and a memory for storing results connected to the timer;

sampling the capacitance of at least one of the strain detectors; and recording when the capacitance changes.

8. A method of testing of claim 7 further comprising the steps of providing a time stamp in the memory based on when the capacitance across at least one of the strain detectors changes.

9. A method of testing of claim 8 wherein the strain detectors are wired together in parallel to allow testing of the strain detectors concurrently.

10. A method of testing of claim 8 further comprising the step of providing a battery on the printed circuit board to power the strain monitoring device.

11. A method of testing of claim 7 wherein the step of mounting the strain detector occurs on production printed circuit board assemblies.

12. A method of testing of claim 7 wherein the step of mounting the strain detector occurs on printed circuit boards not designed to receive a strain detector.

13. A method of claim 7:

wherein the strain detector is made of a single uniform material; and wherein determining if failure has occurred at a pre-defined location includes sensing a failure due to a stress concentration at the pre-defined location exceeding a pre-defined threshold strain range.

14. A printed circuit board assembly comprising:

a circuit board substrate;

a plurality of mounting points for receiving electrical components carried on the circuit board substrate;

a plurality of electrically conductive pathways carried on the circuit board substrate between mounting points; and at least one strain detector mounted on the circuit board substrate, the strain detector formed of a non-ductile material;

wherein one of the electrical components is an integrated circuit package having a plurality of corners, and further comprising:

at least three strain detectors, each of the strain detectors located in proximity to a corner of the integrated circuit package, the longitudinal axis of the strain detector bisecting the adjacent corner; and a strain monitoring device having a timer connected to at least one strain detector and a memory for storing results connected to the timer.

15. A printed circuit board assembly of claim 14 wherein the strain detectors are wired together in parallel to allow testing of the strain detectors concurrently.

16. A printed circuit board assembly of claim 14 further comprising a battery on the circuit board substrate to power the strain monitoring device.

* * * * *

UNITED STATES PATENT AND TRADEMARK OFFICE
CERTIFICATE OF CORRECTION

| | |
|---|---|
| PATENT NO. | : 7,621,190 B2 |
| APPLICATION NO. | : 11/358271 |
| DATED | : November 24, 2009 |
| INVENTOR(S) | : Ahmad et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 432 days.

Signed and Sealed this

Fourteenth Day of December, 2010

David J. Kappos
*Director of the United States Patent and Trademark Office*